United States Patent
Herchen

[19]

[11] Patent Number: 6,088,213
[45] Date of Patent: Jul. 11, 2000

[54] BIPOLAR ELECTROSTATIC CHUCK AND METHOD OF MAKING SAME

[75] Inventor: Harald Herchen, San Jose, Calif.

[73] Assignee: Applied Materials, Inc., Santa Clara, Calif.

[21] Appl. No.: 08/890,733

[22] Filed: Jul. 11, 1997

[51] Int. Cl.[7] .............................. H01G 3/00; H01N 3/00; H01T 23/00
[52] U.S. Cl. .......................... 361/234; 361/699; 361/704; 361/707; 361/715; 257/714
[58] Field of Search ..................... 257/731, 713, 257/711; 361/704, 707, 715, 699, 234; 279/128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 5,155,652 | 10/1992 | Logan et al. | 361/234 |
| 5,191,506 | 3/1993 | Logan et al. | 361/234 |
| 5,350,479 | 9/1994 | Collins et al. | 156/345 |
| 5,413,360 | 5/1995 | Atari et al. | 279/128 |
| 5,511,799 | 4/1996 | Davenport et al. | 277/236 |
| 5,535,090 | 7/1996 | Sherman | 361/234 |
| 5,539,179 | 7/1996 | Nozawa et al. | 219/121.43 |

FOREIGN PATENT DOCUMENTS

| | | | |
|---|---|---|---|
| 60-261377 | 12/1985 | Japan | H02N 13/00 |
| 62-157752 | 7/1987 | Japan | B23Q 3/15 |

*Primary Examiner*—Mahshid Saadat
*Assistant Examiner*—Jhihan B Clark
*Attorney, Agent, or Firm*—Raymond Moser

[57] ABSTRACT

Apparatus for retaining a semiconductor wafer in a semiconductor wafer processing system. The apparatus comprises a support pedestal for supporting the wafer, first and second coplanar electrodes in the support pedestal for creating a chucking force, a cathode electrode for establishing wafer processing conditions and a third gap fill electrode positioned vertically between the first and second electrodes, such that the gap fill electrode is radially coincident with the gap between the first and second electrodes. A method of making the wafer retaining apparatus may comprise the steps of depositing electrode layers over molten, drawn sapphire layers to form a unitary bipolar electrostatic chuck having a gap fill electrode spaced between a pair of bipolar chucking electrodes and an RF powered electrode and radially coincident with the gap between the bipolar chucking electrodes.

10 Claims, 4 Drawing Sheets

BIPOLAR ELECTROSTATIC CHUCK AND METHOD OF MAKING SAME

BACKGROUND OF THE INVENTION

1. Field of the Invention

The invention relates generally to electrostatic chucks for holding a workpiece and, more specifically, to an improved bipolar electrostatic chuck for use in a plasma-enhanced environment and a method for making the improved bipolar electrostatic chuck.

2. Description of the Background Art

Electrostatic chucks are used for holding a workpiece in various applications ranging from holding a sheet of paper in a computer graphics plotter to holding a semiconductor wafer within a semiconductor wafer process chamber. Although electrostatic chucks vary in design, all are based on the principle of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used in process chambers for clamping wafers to a support surface of a pedestal during processing. The pedestal may form both an electrode and a heat sink as used in plasma-enhanced etching, chemical vapor deposition (CVD) or physical vapor deposition (PVD) applications. One form of electrostatic chuck that clamps the wafer to the support surface of the pedestal and establishes optimal heat transfer conditions between the chuck and the wafer is a "bipolar" electrostatic chuck. Bipolar chucks are well known in the art. For example, U.S. Pat. No. 4,384,918 issued May 24, 1983 to Abe discloses a bipolar chuck for use in a plasma-enhanced etch chamber. More specifically, a bipolar chuck contains two, coplanar electrodes embedded beneath the support surface of the pedestal. The two electrodes are biased by either a DC or AC power source. An electric field is created between the two electrodes and is coupled through the wafer. The electric field causes charges to migrate along the underside of the wafer. As such, the wafer and the electrodes accumulate oppositely polarized charges and the wafer is clamped to the support surface of the pedestal. This configuration allows the wafer to be chucked immediately upon placement onto the support surface and without the need for a plasma within the chamber. Therefore, a heat transfer gas is introduced between the wafer and support surface before plasma formation and wafer processing. Additionally, the gas remains at this wafer-to-chuck interface after processing and powering down of the plasma power source affording greater temperature control.

To facilitate plasma excitation, a third electrode is embedded within the pedestal at a location below the electrostatic chuck electrodes. This third electrode (a cathode electrode) is connected to an RF source to produce an electric field within the chamber such that a plasma is excited above the wafer surface. The electric field extends from the cathode electrode to the grounded walls and top (together forming the anode electrode) of the process chamber. The electric field penetrates the chuck electrodes to enter the process chamber. More accurately, the RF energy is capacitively coupled from the cathode electrode to the pair of chuck electrodes and then from the chuck electrodes to the anode.

Typically, a bipolar electrostatic chuck has a gap between the chuck electrodes to prevent a short circuit of the electric field established at the support surface by the chucking voltage. This gap is usually on the order of 0.3 to 5 mm wide. Nonetheless, this rather small gap is sufficiently wide to alter the RF electric field above the support surface of the pedestal. This condition creates a non-uniform plasma above the wafer and a subsequent non-uniformly processed wafer. Consequently, the state of the art does not provide a bipolar electrostatic chuck capable of maintaining uniform plasma conditions.

Therefore, there is a need in the art for an apparatus that is capable of exploiting the advantages of bipolar electrostatic chucks while reducing their inherent characteristic of plasma non-uniformity.

SUMMARY OF THE INVENTION

The disadvantages heretofore associated with the prior art are overcome by an apparatus for retaining a semiconductor wafer in a semiconductor wafer processing system. The system comprises a support pedestal for supporting the wafer, a pair of electrodes embedded in the support pedestal for creating a chucking force to electrostatically clamp a wafer to the support pedestal, a cathode electrode also embedded in the support pedestal for establishing wafer processing conditions. A novel gapfill electrode is positioned vertically spaced apart from but parallel to the chuck electrodes. The gap fill electrode spans the gap between the chuck electrodes. As such, the combination of the gapfill electrode and the chuck electrodes electrically form a unitary electrode as viewed from the cathode electrode. Consequently, the gap has no effect upon the RF electric field.

A method of making the wafer retaining apparatus comprises the steps of depositing a first electrode layer (cathode electrode) over a base layer of a high resistivity dielectric (i.e., sapphire), drawing an intermediate layer of dielectric material over the first electrode layer, depositing a second electrode layer (gap fill electrode) over the intermediate dielectric layer, drawing a third layer of dielectric material over the second electrode layer, depositing a third electrode layer (chuck electrode) over the third layer of dielectric material and drawing a fourth layer of dielectric material over the third electrode layer. Preferably, the dielectric material is sapphire.

The subject invention reduces the non-uniformity of a wafer processing plasma that is inherent in systems that employ bipolar electrostatic chucks by emulating a monopolar chuck. Specifically, the gap between a pair of bipolar chuck electrodes allows charges influenced by an RF powered pedestal electrode to migrate to the chuck surface. As such, electric field above the wafer and thus the plasma are undesirably distorted. The novel gap fill electrode electrically "fills" the void created by the bipolar chuck electrodes. It mitigates migrating charges and is driven to a potential comparable to the neighboring bipolar chuck electrodes without degrading the chucking force applied to the wafer. The use of sapphire as the dielectric material assures that there will be minimal charge migration to the gap fill electrode when used in bipolar mode.

BRIEF DESCRIPTION OF THE FIGURES

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
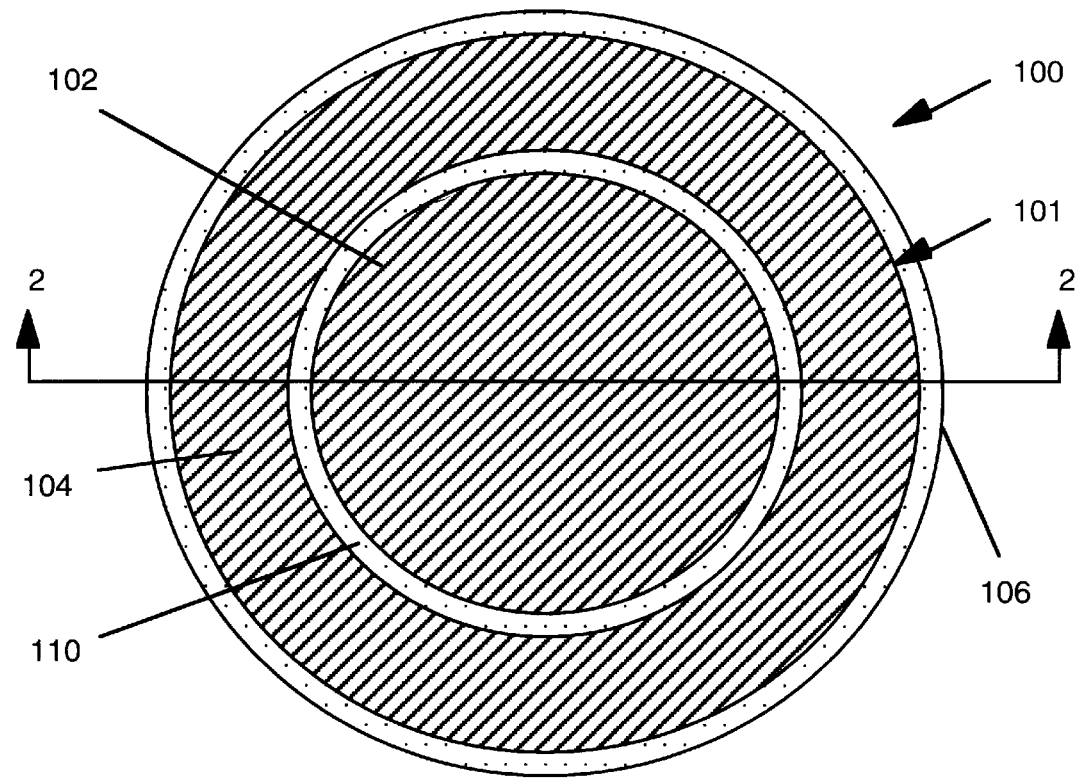
FIG. 1 is a top, sectional view of a prior art, cathode pedestal containing a bipolar electrostatic chuck taken along line 1—1 of FIG. 2A.
Figure 2A:
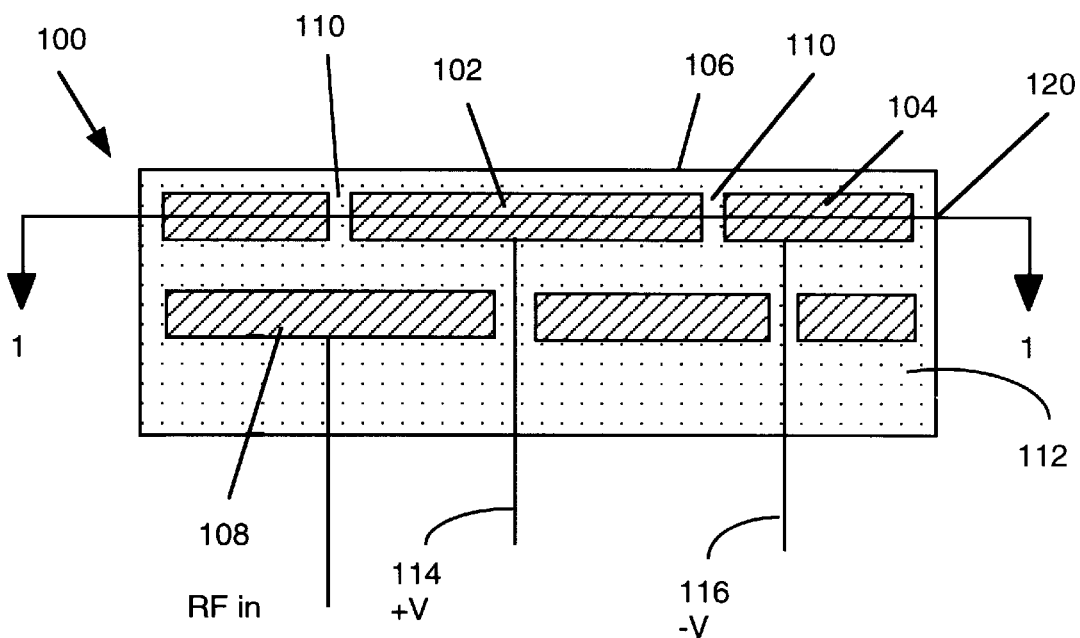
FIG. 2A is a cross-sectional view of the apparatus of FIG. 1 as seen along lines 2—2 of FIG. 1.

FIG. 1 depicts a top, sectional view of a prior art cathode pedestal 100 containing a bipolar electrostatic chuck 101 adapted to support and electrostatically retain a workpiece to be processed, such as a semiconductor wafer (not shown). FIG. 2 depicts a cross-sectional view of the cathode pedestal 100 taken along line 2—2 of FIG. 1. For a complete description, the reader should refer to FIGS. 1 and 2 simultaneously.

Figure 2B:
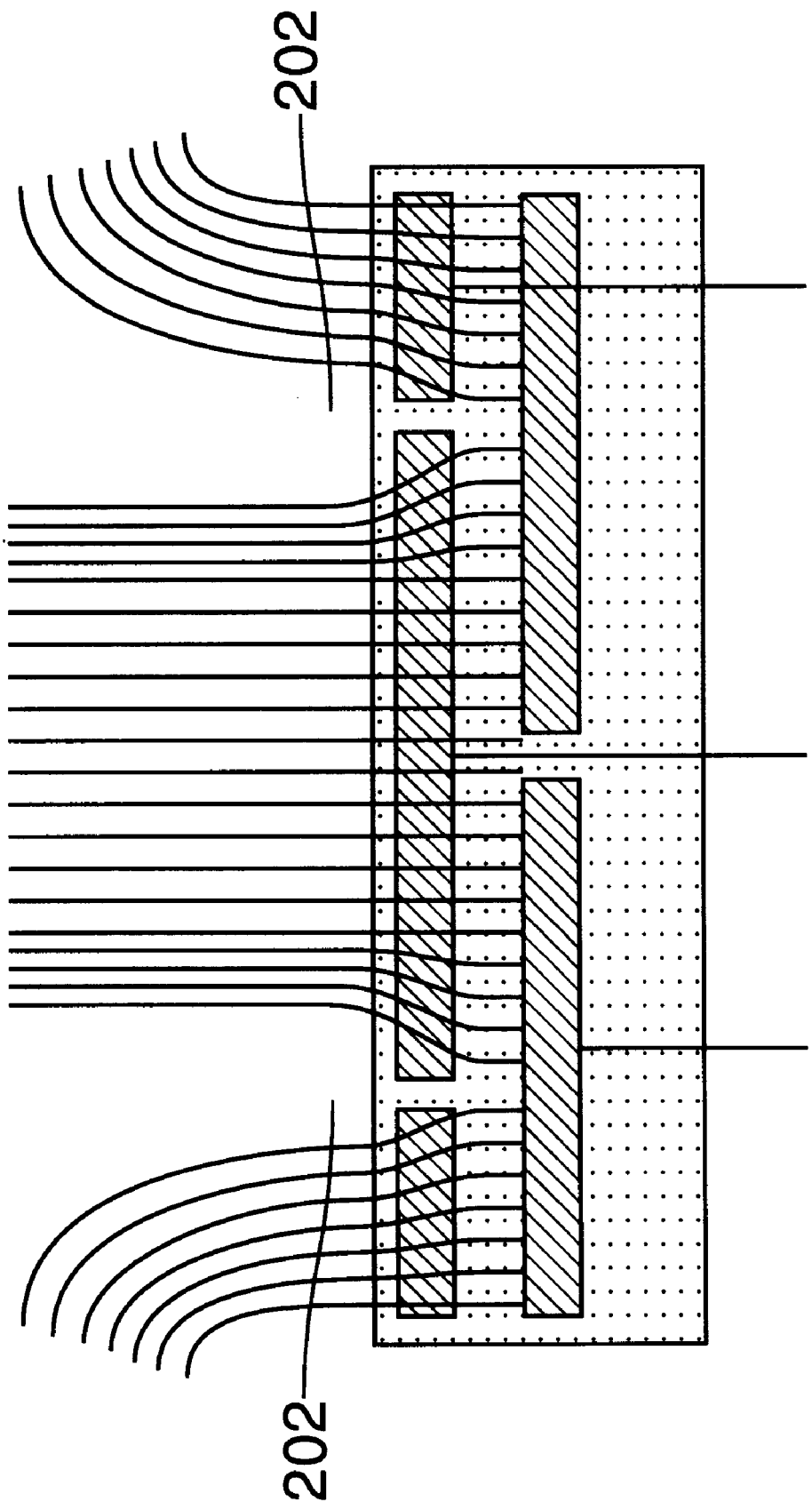
FIG. 2B is a cross-sectional view of the apparatus of FIG. 1 as seen along lines 2—2 of FIG. 1 depicting the electric field generated between the cathode pedestal and the anode chamber walls and top.

The cathode pedestal 100 is constructed from a slab of dielectric material 112 (i.e., aluminum oxide, or other ceramic having high resistivity containing a cathode electrode 108 embedded with the slab 112. Alternately, rather than have an embedded cathode electrode, the cathode pedestal base (not shown), a metallic (stainless steel) structure that supports the pedestal within a process chamber, may function as the cathode electrode. The cathode electrode 108 is conductive and is connected to a high power RF source (not shown) to provide the necessary RF power to the cathode pedestal 100 to excite a plasma within the process chamber. The cathode pedestal 100 further contains a bipolar electrostatic chuck 101. At least one pair of co-planar electrodes are embedded within the slab 112 to form an electrode plane 120. The bipolar chuck electrodes are also conductive and may be fashioned from a metallic material such as tungsten. Specifically, inner electrode 102 and outer electrode 104 form a set of concentric ring electrodes for electrostatically chucking a wafer to the surface 106 of the pedestal 100. Each of the bipolar chuck electrodes 102 and 104 is biased with an equal and opposite voltage (+V, −V) through power leads 114 and 116, respectively. The electric field established between the bipolar chuck electrodes 102 and 104 induces a charge accumulation on the backside of a wafer that pulls the wafer to the surface 106. Additionally, a gap 110 exists between the bipolar chuck electrodes 102 and 104 to prevent short circuiting of the electrodes and the electric field generated therebetween. As discussed above, this gap influences (i.e., distorts the electric field established by the cathode electrode 108 and resultant plasma above the wafer (not shown). FIG. 2B depicts the electric field of the prior art pedestal 100 under the distortion phenomenon. Specifically, during wafer processing gaps 202 in the uniformity of the electric field established by connection of the high power RF source to the cathode electrode 108 occur as that field couples to the embedded chuck electrodes more effectively than through the gap 110.

Figure 3:
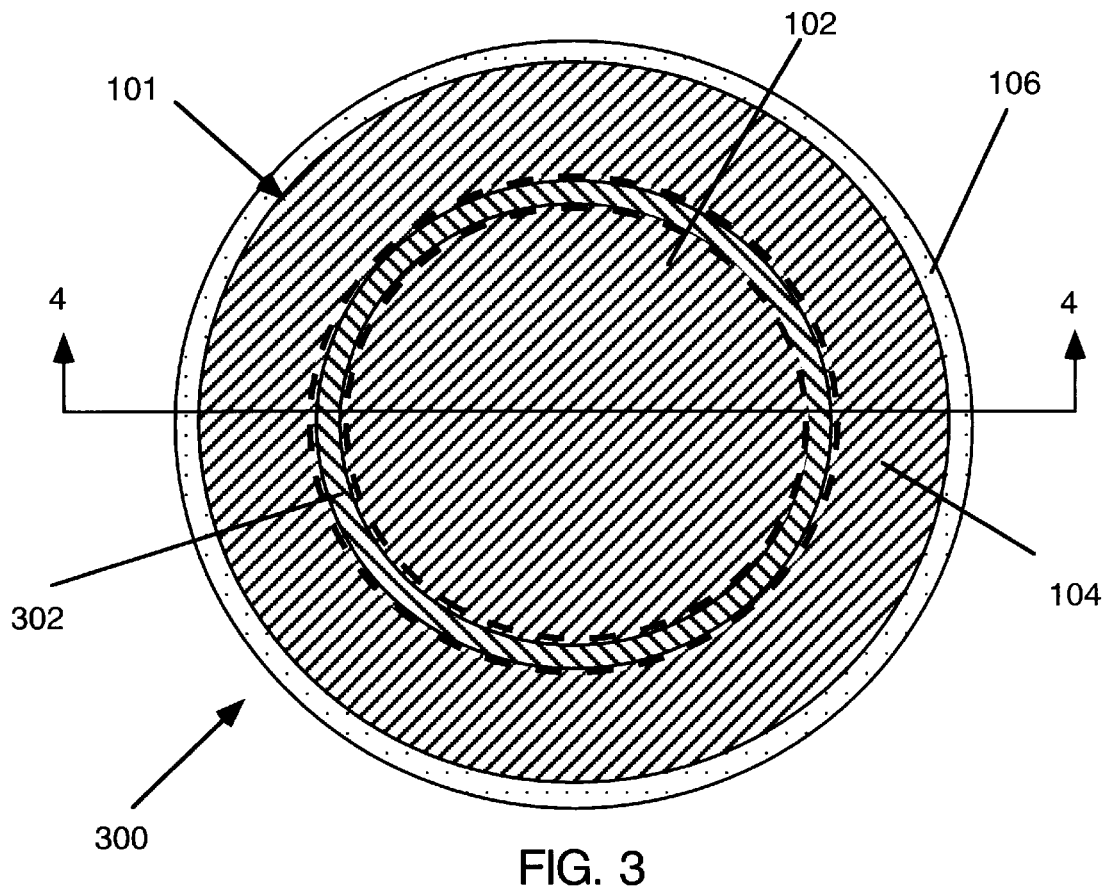
FIG. 3 is a top, sectional view of the inventive apparatus taken along line 3—3 of FIG. 4.
Figure 4A:
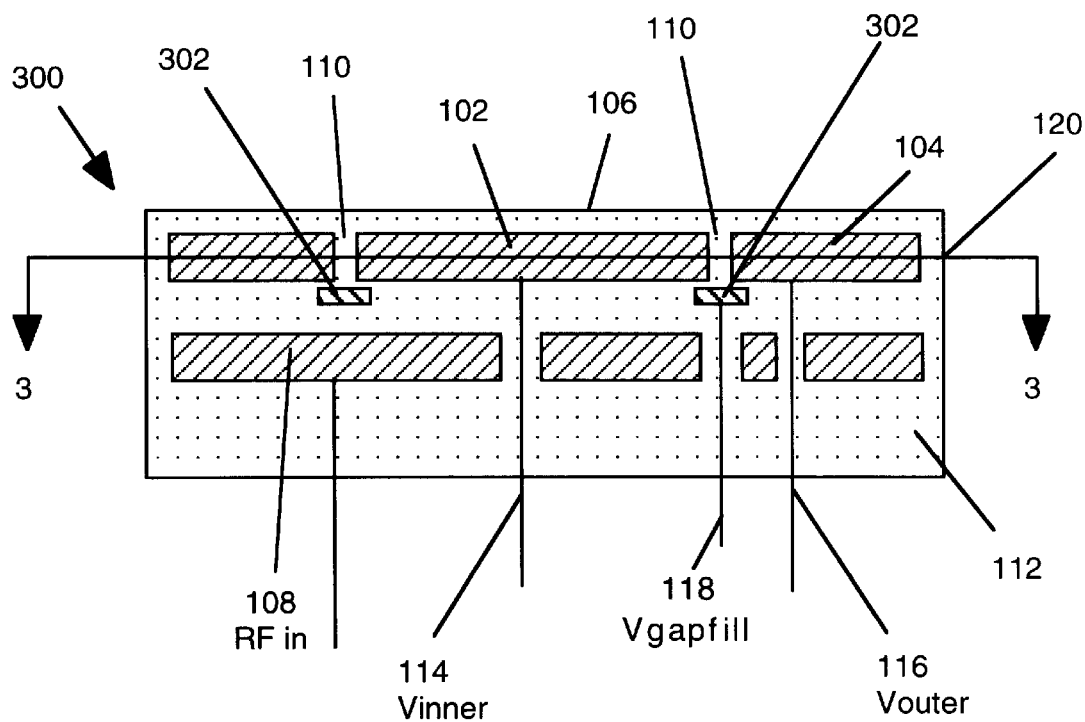
FIG. 4A is a cross-sectional view of the inventive apparatus of FIG. 3 as seen along lines 4—4 of FIG. 3.

FIGS. 3 and 4A depict a pedestal 300 containing a bipolar chuck 101 and a novel apparatus 302 that compensates for the non-uniformity of the plasma caused by the gap 110. Specifically, the pedestal 300 contains all of the components discussed in the prior art pedestal 100 to retain a semiconductor wafer (not shown) for processing. In a preferred embodiment, the dielectric slab material 112 is a particularly good insulating dielectric, such as sapphire. Sapphire has a very high resistivity (i.e., >$10^{15}$ ohm-cm) which makes it extremely useful in this application as will be explained below.

Additionally, a separate gap fill electrode 302 is provided proximate the gap 110. The gap fill electrode 302 is also a concentric ring and is radially coincident with the gap 110. The gap fill electrode 302 is fashioned from a conductive material, preferably a refractory metal such as rhenium, tungsten, molybdenum, niobium, tantalum and the like. Materials such as these have desirable electrical characteristics at high pedestal operating temperatures. The gap fill electrode is biased with a voltage through power lead 118. The width of the gap fill electrode 302 is slightly larger than the width of the gap 110. The gap fill electrode 302 is positioned vertically below the bipolar chuck electrode plane 120 such that the gap fill electrode is spaced apart but parallel to the plane 120. Ideally, the gap fill electrode 302 is positioned a few thousands of an inch below the bipolar chuck electrodes 102 and 104. In this manner, the gap fill electrode 302 slightly overlaps the chuck electrodes 102 and 104 and spans the gap 110 without touching the bipolar chuck electrodes 102 and 104.

The gap fill electrode functions as a floating electrode that allows the chuck to operate in a bipolar mode for chucking when no RF power (hence, plasma) is present in the chamber and in a "monopolar" mode when RF power and plasma are present in the chamber. For example, prior to wafer processing, no RF power or plasma is present in the chamber. At this time, a wafer (not shown) is placed on the chuck surface 106. To chuck the wafer, chucking voltages +V and −V are applied to the inner 102 and outer 104 electrodes respectively. Alternately, the polarity of the chucking voltages can be reversed. The attractive force between the electrodes retains the wafer to the chuck surface 106. In bipolar mode, preferably no voltage is applied to the gap fill electrode 302 although any voltage in the range of approximately −V to +V may be applied.

Once the RF power is turned on and a plasma ignited, the inner 102, outer 104 and gap fill 302 electrodes are all biased with a voltage +V. In "monopolar" mode, the chuck retains the wafer by the attractive forces between the pedestal 300, wafer, plasma and other chamber components (i.e., chamber side walls and lid not shown) whereby the plasma functions as the return path for RF current. A complete description of the principle and operation of a monopolar electrostatic chuck is disclosed in commonly assigned U.S. Pat. No. 5,350,479 issued Sep. 27, 1994 to Collins et al and is herein incorporated by reference.

In an alternate embodiment for the "monopolar" mode, the inner electrode 102 is biased with a voltage +V, the outer electrode 104 is biased with a voltage −V−$2V_W$ and the gap fill electrode 302 is biased with a voltage −V−$2V_W$ where $V_W$ is defined as the voltage on the wafer. In a third embodiment for the "monopolar" mode, the inner electrode and outer electrode are biased as they were in the second embodiment and the gap fill electrode is biased with a voltage +V.

After wafer processing has been completed, the RF power is turned off. At this point, the chuck is switched back to bipolar mode to retain the wafer on the pedestal. As such, temperature of the wafer is maintained until it is removed from the chamber. In other words, the inner and outer electrodes are biased in the same manner as discussed above, previous to the plasma ignition. Table 1 summarizes the voltages for the chucking and gap fill electrodes for all wafer processing conditions.

TABLE 1

| Electrode | Applied voltage on electrodes when no RF (no plasma) | Applied voltage on electrodes with RF (with plasma in contact with wafer) | |
| --- | --- | --- | --- |
| | | Option 1 | Option 2 |
| $V_{inner}$ | +V | +V | +V |
| $V_{outer}$ | −V | +V | $-V - 2V_w$ |
| $V_{gapfill}$ | −V, O, or +V | +V | $-V - 2V_w$ or +V | where $V_w$ is the wafer potential

Figure 4B:
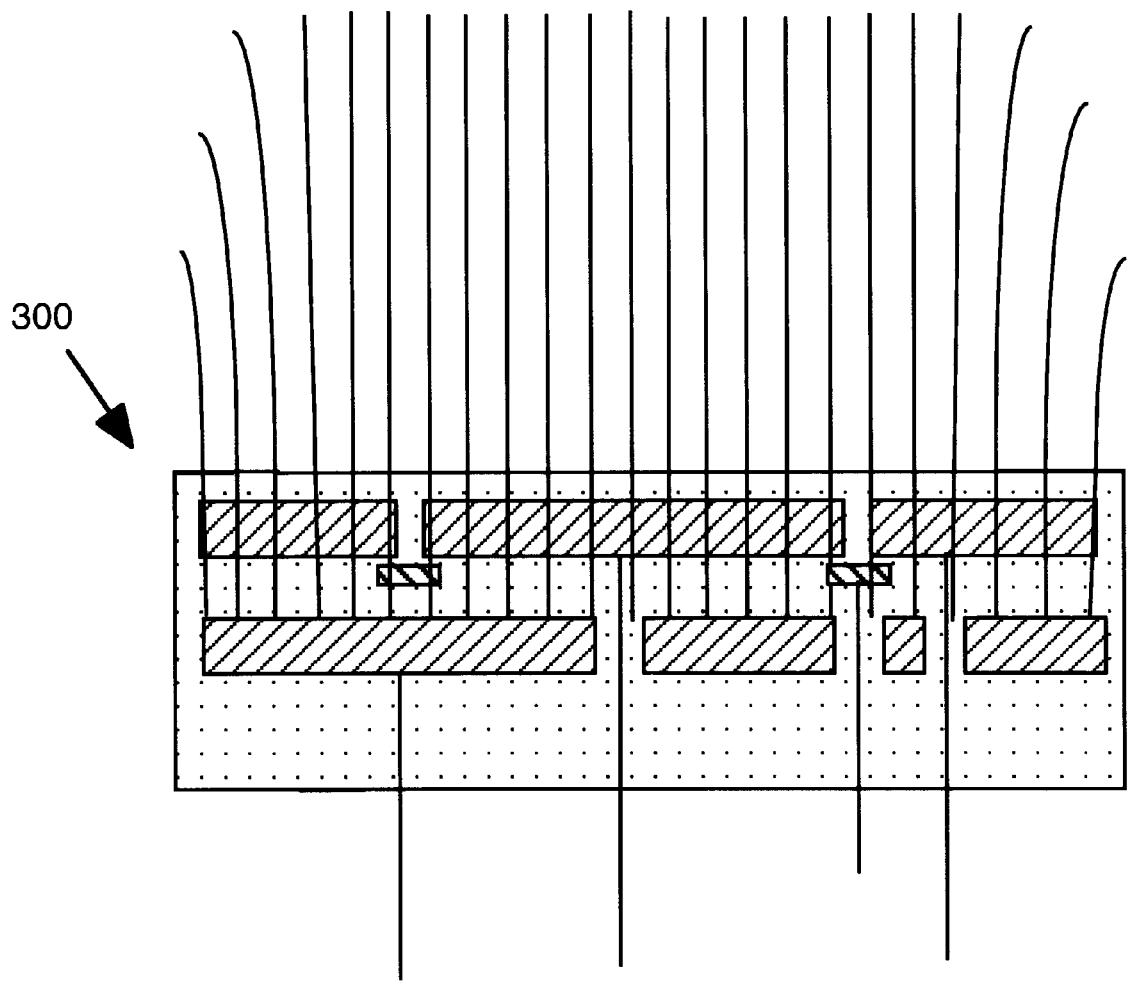
FIG. 4B is a cross-sectional view of the inventive apparatus of FIG. 3 as seen along lines 4—4 of FIG. 3 depicting the improved electric field generated between the cathode pedestal and the anode chamber walls and top.

The effect of the gap fill electrode 302 on the RF induced electric field is seen in FIG. 4B. Specifically, when the chuck is operating in "monopolar" mode, the gap fill electrode 302 capacitively couples the RF electric field to the plasma in the same way that the chuck electrodes couple the RF electric field to the plasma. Because of the electrical characteristics of the dielectric slab material (i.e., sapphire, aluminum nitride or the like), very little charge migration through the slab is realized. Therefore, a small amount of charges in the slab are intercepted by the gap fill electrode 302. Moreover, with very little charge migration through the slab, the gap fill electrode can be placed in close proximity to the bipolar chuck electrodes 102 and 104 without effecting the chucking voltages. The chuck electrodes, and the gap fill electrode electrically form a unitary electrode as viewed by the cathode electrode 108. As such, the electric field above a wafer is more uniformly distributed and plasma uniformity is maintained, thus wafer processing is not compromised.

Previously, sapphire had not been considered a viable material for use in electrostatic chucks because of the high manufacturing cost associated with the material and the unusually high resistivity. Additionally, it is difficult to join or bond monocrystalline ceramics (such as sapphire) to each other or to an electrode. Prior art U.S. Pat. Nos. 5,413,360 to Atari and 5,535,090 to Sherman teach various methods of joining these components and are herein incorporated by reference. Commonly invented and assigned U.S. patent application Ser. No. 08/812,194, filed Mar. 6, 1997 is also incorporated by reference. That application discloses a novel process for forming layered sapphire electrostatic chuck. Specifically, a molten ceramic material is drawn through a capillary tube by capillary forces. As the material is drawn through the capillary tube, it is deposited upon a workpiece surface. Upon cooling, the molten ceramic material forms a monocrystalline ceramic layer comprising large crystals substantially oriented to one another. The resultant product is a layered ceramic chuck that does not use adhesives between the layers and is capable of withstanding higher operating temperatures than previously possible.

Since the use of sapphire is extremely desirable in the subject invention, a method of making a sapphire electrostatic chuck is disclosed. Ideally, layers of molten sapphire are drawn onto electrode layers until the desired chuck is formed. Specifically, a base layer of dielectric material forms a bottom layer of the chuck. The base layer can be formed from a monocrystalline ceramic (i.e., sapphire) or another type of ceramic. Next, a first electrode layer is deposited on top of the base dielectric layer to form the RF electrode 108. An intermediate dielectric layer is drawn on top of the first electrode layer. A second electrode layer is then deposited over the intermediate dielectric layer. The second electrode layer forms the gap fill electrode 302. A third dielectric layer is drawn over the second electrode layer. A third electrode layer is deposited over the third dielectric layer. This electrode layer forms the bipolar chuck electrodes 102 and 104. Lastly, a fourth dielectric layer is drawn over the bipolar chuck electrodes to form the top surface of the electrostatic chuck 106.

In a preferred method of making the inventive chuck, the thicknesses of the electrode and dielectric layers are approximately in the range of the following values: first electrode layer—150–15,000 microns; base dielectric layer—0–0.500 in.; intermediate dielectric layer—0.030–0.500 in.; gap fill electrode—1–50 microns; third dielectric layer—0.002–0.025 in.; third electrode layer—1–50 microns and fourth dielectric layer—0.002–0.015 in.

Although the method of forming the inventive chuck is a bottom-up construction of stacked component layers, this does not preclude making the chuck by other methods known by those skilled in the art of making layered electrostatic chucks. Such methods include but are not limited to top-down construction. Additionally, the electrode materials may be selected and combined in any manner required to achieve the desired chucking and plasma uniformity conditions. By similar reasoning, the thickness of the dielectric layers can be altered to achieve the desired chucking and plasma uniformity conditions.

Although the use of sapphire for the dielectric slab material and platinum, tungsten, molybendum for the gap fill electrode are discussed, any type of dielectric may be used for the slab material and any refractory metal or material having similar electric characteristics may be used for the RF electrode, gap fill electrode and chucking electrodes. The dielectric slab material 112 is, for example, also aluminum-nitride or boron-nitride. Such a partially conductive (low resistivity) ceramic material promotes the johnsen-Rahbek effect during high temperature processing. ther partially conductive ceramics also form useful high temperature chuck materials such as alumina doped with a titanium oxide or a chromium oxide. If the chuck 100 is to be used at low temperatures only, then other ceramic and/or dielectric materials such as alumina are used. An illustrative ceramic electrostatic chuck is disclosed in commonly assigned U.S. Pat. No. 5,511,799 issued Apr. 30, 1996, and Japanese Laid-Open patent application no. 60-261377 laid open Dec. 24, 1985, both of which are herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

Although various embodiments which incorporate the teachings of the present invention have been shown and described in detail herein, those skilled in the art can readily devise many other varied embodiments that still incorporate these teachings.

What is claimed is:

1. An apparatus for retaining a semiconductor wafer in a semiconductor wafer processing system comprising:

a support pedestal for supporting the wafer, first and second coplanar electrodes embedded in the support pedestal defining a gap between the electrodes and a third gap fill electrode embedded in the support pedestal proximate said gap for reducing non-uniformity in an electric field there above.

2. The apparatus of claim 1 further comprising:
a cathode electrode positioned below the first and second electrodes and the gap fill electrode.

3. The apparatus of claim 2 wherein the first and second electrodes are two concentric ring electrodes.

4. The apparatus of claim 3 wherein the third electrode further comprises a concentric ring gap fill electrode positioned vertically between the bipolar electrode plane and the cathode electrode, radially coincident with the gap.

5. The apparatus of claim 4 wherein the gap fill electrode is comprised of a material selected from the group consisting of rhenium, tungsten, niobium, tantalum or molybendum.

6. The apparatus of claim 5 wherein the support pedestal is further comprised of a dielectric material.

7. The apparatus of claim 6 wherein the dielectric material is sapphire.

8. The apparatus of claim 7 wherein the support pedestal is formed of layers of sapphire drawn over deposited electrode layers.

9. An apparatus for retaining a semiconductor wafer in a semiconductor wafer processing system comprising:
a support pedestal comprised of sapphire for supporting the wafer,
a pair of concentric ring, bipolar chucking electrodes proximate a top surface of the support pedestal, the bipolar chucking electrodes having a gap therebetween and defining a plane,
a radio frequency (RF) powered electrode positioned below the bipolar chucking electrode plane, and
a concentric ring gap fill electrode comprised of a material selected from the group consisting of rhenium, tungsten, niobium, tantalum or molybendum positioned vertically between the bipolar electrode plane and the radio frequency powered electrode, radially coincident with the gap.

10. An apparatus for retaining a semiconductor wafer in a semiconductor wafer processing system comprising:
a support pedestal for supporting the wafer,
first and second coplanar electrodes embedded in the support pedestal defining a gap between the electrodes, said gap having a width and
a third gap-fill electrode proximate said gap for reducing non-uniformity in an electric field there above wherein said third electrode has a width that is larger than the width of said gap.

* * * * *